United States Patent [19]

Mecklenburg

[11] 4,075,554
[45] Feb. 21, 1978

[54] VSWR METER CIRCUIT USING VARIABLE RF ATTENUATOR

[75] Inventor: Frank Howard Mecklenburg, Shaker Heights, Ohio

[73] Assignee: Bird Electronic Corporation, Solon, Ohio

[21] Appl. No.: 738,474

[22] Filed: Nov. 3, 1976

Related U.S. Application Data

[63] Continuation-in-part of Ser. No. 719,565, Sept. 1, 1976.

[51] Int. Cl.² .................. G01R 27/02; G01R 21/04
[52] U.S. Cl. ................................ 324/58 B; 324/95
[58] Field of Search ............. 324/95, 58 B; 324/58 R, 324/58 A

[56] References Cited

U.S. PATENT DOCUMENTS

| 2,412,393 | 12/1946 | Ghosh | 324/58 B |
| 2,818,547 | 12/1957 | Laemmel | 324/58 B |
| 2,925,556 | 2/1960 | Schimmel | 324/95 |

Primary Examiner—Rudolph V. Rolinec
Assistant Examiner—Ernest F. Karlsen
Attorney, Agent, or Firm—Bosworth, Sessions & McCoy

[57] ABSTRACT

A VSWR meter circuit using a variable RF attenuator for use in an electronic instrument for detecting and measuring the forward and reflected RF voltage wave signals on a coaxial transmission line. The instrument is integral with a coaxial line section adapted to be electrically inserted in a tubular transmission line, the line section having an outer conductor with a coaxial center conductor therein. An inductive pick-up coil is mounted in the field surrounding the center conductor for rotation about an axis normal to the axis of the line section and is responsive to the voltage wave signal on the transmission line. A D'Arsonval meter movement is connected to the pick-up coil through a meter circuit designed so that the meter provides an indication of the level of either the forward voltage wave signal or the reflected wave signal depending on the orientation of the inductive pick-up coil.

1 Claim, 9 Drawing Figures

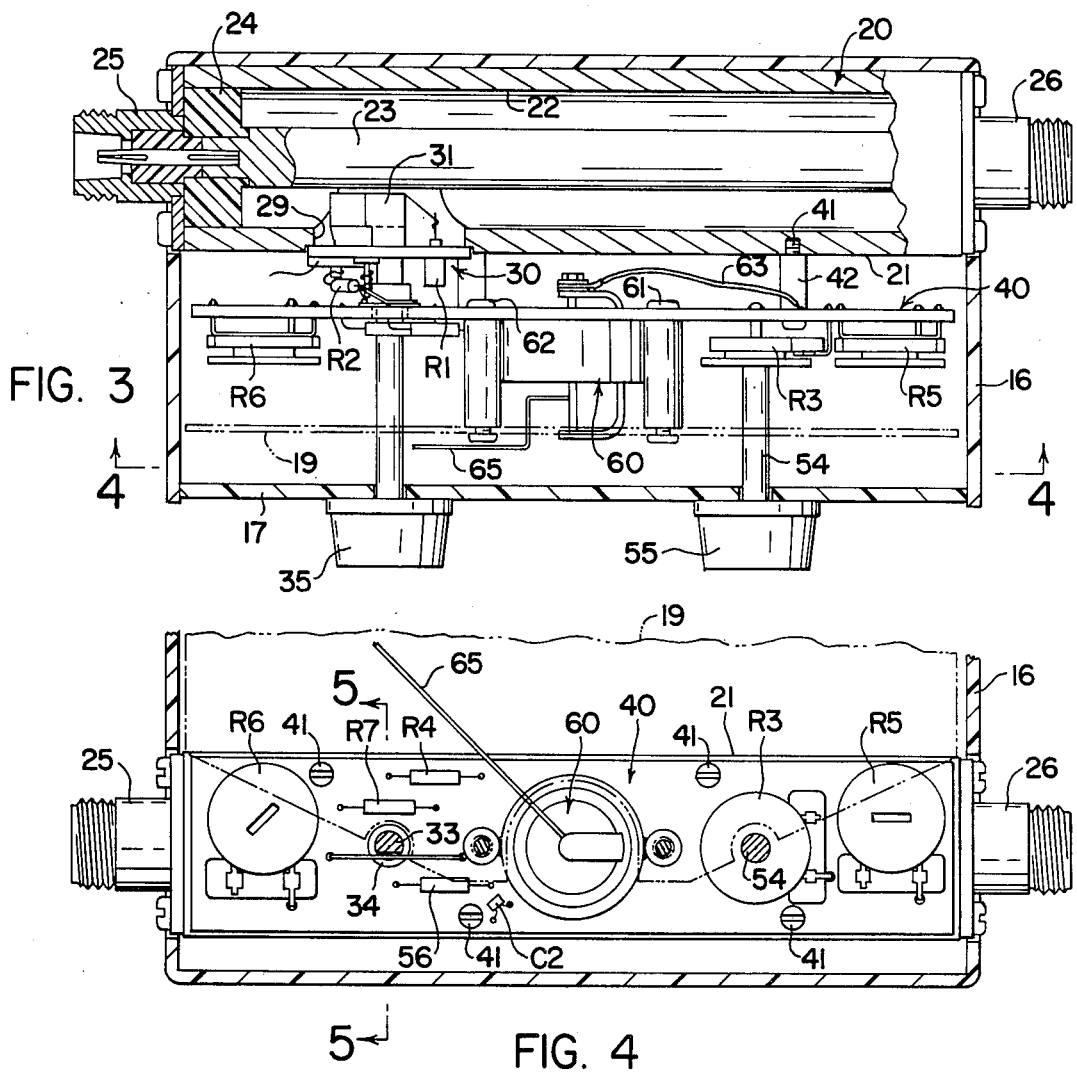
FIG. 3
FIG. 4
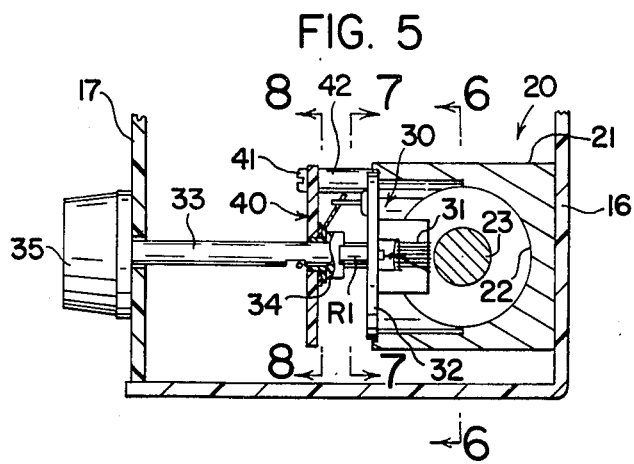
FIG. 5
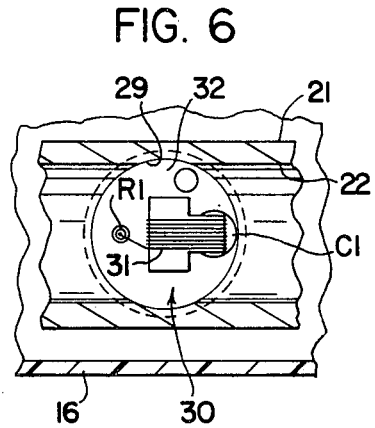
FIG. 6

VSWR METER CIRCUIT USING VARIABLE RF ATTENUATOR

CROSS REFERENCE TO RELATED APPLICATION

This application is a continuation-in-part of U.S. Pat. application Ser. No. 719,565, filed Sept. 1, 1976.

BACKGROUND OF THE INVENTION

This invention relates to electronic instruments for detecting and measuring RF voltage wave signals on coaxial transmission lines such as between a transmitting antenna and a transmitter. More particularly, the invention relates to an "insertion-type" RF directional wattmeter for detecting and measuring both the forward and reflected voltage wave signals on a coaxial transmission line.

Insertion-type RF directional wattmeters are used in many applications in the RF field, particularly, in matching antennas to transmission lines and in minimizing the voltage standing wave ratio (VSWR) on the line. One application that is becoming increasingly important is in connection with CB transmitters that are currently so popular in the United States for use in automotive vehicles. These installations require accurate impedance matching in view of the limited power permitted.

Meters currently available for this application are, for example, of the type disclosed in U.S. Pat. Nos. 2,852,741 and 2,891,221.

In these units a rigid, coaxial line section is inserted in the coaxial transmission line such as by standard coaxial connectors and an inductive pick-up coil positioned in a transverse opening in the outer conductor of the line section is adapted for rotation about an axis normal to the axis of the line section. The pick-up coil is connected by special leads to a D'Arsonval meter movement and the resulting meter reading indicates the magnitude of the wave signal in watts, the indication being either that of the magnitude of the forward voltage wave level or the reflected voltage wave level depending upon the particular orientation of the pick-up coil.

The pick-up coil is located in the electrical field between the inner and outer conductors of a coaxial transmission line and has a voltage induced therein proportional to the current I in the inner conductor, there being a mutual inductance M between the loop and the transmission line and the loop being positioned in the plane of the inner conductor of the line. A series circuit of resistance R and capacitance C connected across the transmission line conductors will give a voltage across the resistance R proportional to the voltage E between the line conductors. In directional couplers and so-called reflectometers the arrangements mentioned are combined in a sampling circuit in which the resistor R is connected in series with the loop and capacitive coupling is provided as by capacitor plates or armatures on the loop and the inner conductor or by capacitance effects between the components of the sampling circuit and the inner conductor.

Considering the sampling circuit mentioned and using lumped impedances, it is apparent that M is either positive or negative depending upon the directional relation between the loop and the wave signal energy traveling on the line.

The instrument described obtains reversal of the mutual inductance M through 180° rotation of the loop relative to the transmission line. The forward traveling wave has voltage $E_f$ and current $I_f$ while the reflected traveling wave has voltage $E_r$ and current $I_r$. Thus, if $Z_o$ be the characteristic impedance of the line and p the reflection coefficient:

$$p = E_r/E_f = -I_r/I_f$$

and $$e = jw (CRE + MI)$$

$$= jwE_f[CR(1+p) + (M/Z_o)(1-p)]$$

where $e$ is the total electromotive force induced in the loop or sampling circuit. The components are selected so that:

$$RC = M/Z_o = K$$

$k$ being a constant. If we let $e$ be the electromotive force when M is positive so that the voltage across R and the voltage induced in the loop are additive, and let $e-$ be the electromotive force when M is negative and the voltages referred to are opposed, the former gives a maximum and the latter a minimum indication, thus:

$$e = jwE_f[K(1+p) + K(1-p)]$$

$$= 2jwE_fK$$

$$e- = jwE_f[K(1+p) - K(1-p)]$$

$$= 2jwE_fKp$$

from which the reflection coefficient and standing wave ratio can be obtained. It is also feasible to measure power P being fed through the transmission line:

$$P = EI \cos \theta = E \cdot I$$

$$= (E_f + E_r) \cdot (I_f + I_r)$$

$$= \frac{E_f \cdot E_f}{Z_o} - \frac{E_r \cdot E_r}{Z_o}$$

$$= \frac{|E_f|^2}{Z_o} (1 - |p|^2)$$

$$= \frac{|e+|^2 - |e-|^2}{4w^2K^2Z_o}$$

When it is desirable to build a power meter with variable sensitivity in order to measure ratio or VSWR directly, the usual method is to incorporate a control into the meter circuit between a rectifier diode and the D'Arsonval meter movement.

When it is desirable to build a power meter with variable sensitivity in order to measure ratio or VSWR directly, the usual method is to incorporate a control into the meter circuit between a rectifier diode and the D'Arsonval meter movement.

Since the output of the coupler is proportional to $\sqrt{\text{power}}$ the output of the diode is given by $K_1 \sqrt{\text{power}} - f(\text{diode})$ where $f(\text{diode})$ is not proportional to power. The control varies the sensitivity of the metering circuit so that meter deflection is given by:

$$\text{Deflection} = K_2 \left[ K_1 \sqrt{\text{power}} - f(\text{diode}) \right]$$

-continued or $$\text{Power} = \left[\frac{Def + K_2 f(\text{diode})}{K_2 K_1}\right]^2$$

$K_2$ cannot be factored out and brought to the left hand side of the equation, so the control ($K_2$) does not multiply the power of all points on the scale by the same constant.

The instrument of the present invention avoids the difficulties indicated above and affords other features and advantages heretofore not obtainable.

SUMMARY OF THE INVENTION

It is among the objects of the invention to provide an improved RF VSWR meter circuit for an electronic instrument for detecting and measuring the forward and reflected RF voltage signals on a coaxial transmission line.

Another object is to provide an RF VSWR meter circuit for an electronic instrument of the type described, which reduces distortion of meter scale shape due to diode turn on characteristics.

These and other objects and advantages are achieved with the unique RF VSWR meter circuit design of the invention. The instrument in which the meter circuit design is used comprises a coaxial line section adapted to be inserted in the transmission line and having a tubular rectangular conductive metal body and a coaxial center conductor electrically insulated from the body. An inductive pick-up coil is mounted for rotation about an axis normal to the axis of the line section for sensing and measuring either the forward RF voltage wave signal level or the reflected RF voltage wave signal level in the transmission line.

A D'Arsonval meter movement for indicating on a meter scale the magnitude of the signal sensed by the pick-up coil is connected to the coil through a circuit embodying the invention. The circuit includes a rectifier diode and a variable RF attenuator electrically connected between the diode and the inductive pick-up coil. Accordingly, the deflection of the meter movement means is a constant function of the induced RF voltage level sensed by the inductive pick-up coil and represents either the forward voltage wave signal or the reflected voltage wave signal level on the transmission line depending on the particular orientation of the inductive pick-up coil.

BRIEF DESCRIPTION OF THE DRAWINGS

FIG. 3 is a sectional view taken on the line 3—3 of FIG. 2;

FIG. 4 is a fragmentary sectional view taken on the line 4—4 of FIG. 3;

FIG. 5 is a fragmentary sectional view taken on the line 5—5 of FIG. 4;

FIG. 6 is a fragmentary sectional view taken on the line 6—6 of FIG. 5;

DESCRIPTION OF THE PREFERRED EMBODIMENT

Figure 1:
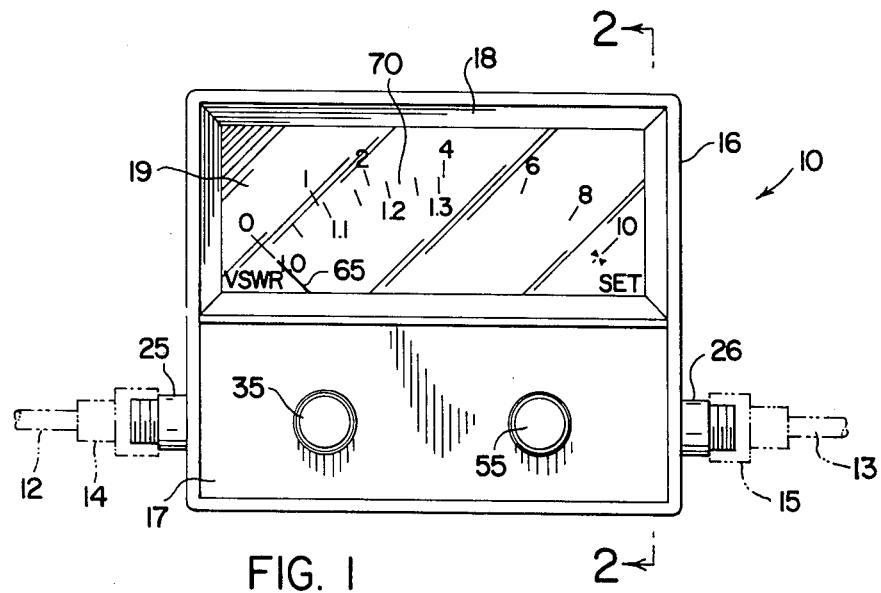
FIG. 1 is an elevational view of an electronic instrument for detecting and measuring the forward and reflected RF voltage wave signals on a coaxial transmission line and having an RF VSWR meter circuit in accordance with the invention.
Figure 2:
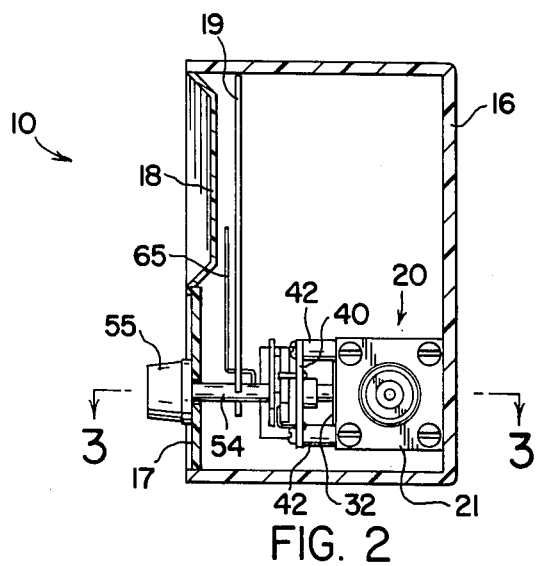
FIG. 2 is a sectional view taken on the line 2—2 of FIG. 1.
Figure 7:
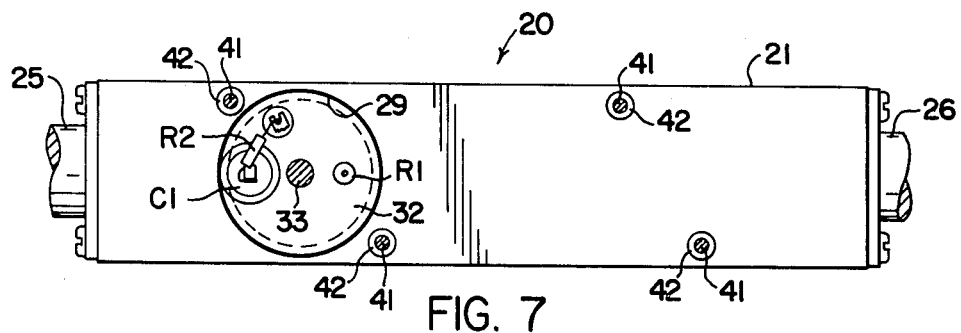
FIG. 7 is a sectional view taken on the line 7—7 of FIG. 5.

Referring more particularly to the drawings, there is shown an RF directional wattmeter 10 typical of the type in which an RF VSWR meter circuit of the invention, and adapted for detecting and measuring the forward and reflected RF voltage wave signals on an RF coaxial transmission line. The ends 12 and 13 of the coaxial cable between which the instrument 10 is inserted have standard coaxial connectors 14 and 15 shown in dashed lines in FIG. 1 that are connected to the instrument 10. The instrument is anchored in a housing 16 of non-conductive molded material, that supports a front panel 17 and a protective transparent window element 18 that protects a meter scale plate 19.

The instrument 10 includes as basic components a line section 20, an inductive pick-up coil element 30, a printed circuit board 40 with associated circuit components, and a D'Arsonval meter movement assembly 60. The line section 20 comprises a tubular conductive metal body 21 formed of aluminum, for example, and defining a longitudinally extending cylindrical space 22 therein. Located within the space 22 is a center conductor 23 supported by and electrically insulated from the tubular body 21 by annular insulators 24 (FIG. 3). Located at each end of the conductive metal body 21 are female-type coaxial connectors 25 and 26 that receive the male-type coaxial cable connectors 14 and 15.

The tubular body 21 has a relatively large transverse bore 29 formed therein, communicating with the cylindrical space 22 (FIGS. 3, 5 and 6). Located partly within the bore 29 and supported by the metal body is a conductive pick-up assembly 30 constructed generally in accordance with U.S. Pat. Nos. 2,852,741 and 2,891,221.

The assembly 30 has an inductive pick-up coil 31 at its inner end positioned within the space 22 and a mounting plate on which the coil 31 and associate circuit components are mounted. The coil 31 and swivel plate 32 are mounted on a shaft 33 journaled in a bushing 34 secured in the printed circuit board 40. A control knob 35 permits rotation of the shaft 33 and corresponding rotation of the pick-up coil 31 so that the coil may be rotated to a position adapted to sense and measure the forward RF voltage wave signal or, on the other hand, a position adapted to sense and measure the reflected RF voltage wave signal level. The circuit components in the assembly 30 include a sampling resistor R1, a band broadening shunt condensor C1 connected across the coil and a series resistor R2.

Figure 8:
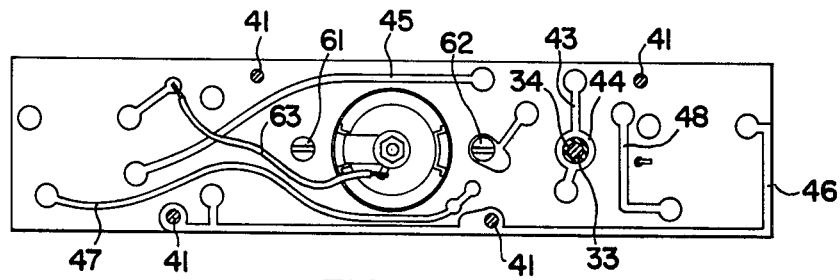
FIG. 8 is a sectional view taken on the line 8—8 of FIG. 5.

The circuit board 40, as best illustrated in FIG. 8, is supported on and spaced from the body 21 by means of screws 41 and conductive spacer sleeves 42 which provide a ground connection. The board has an annular wiper contact zone 44 concentric with the shaft 33 of the element 30 and which is engaged by a contact arm carried on the shaft 33 and connected to the series resistor R2.

Figure 9:
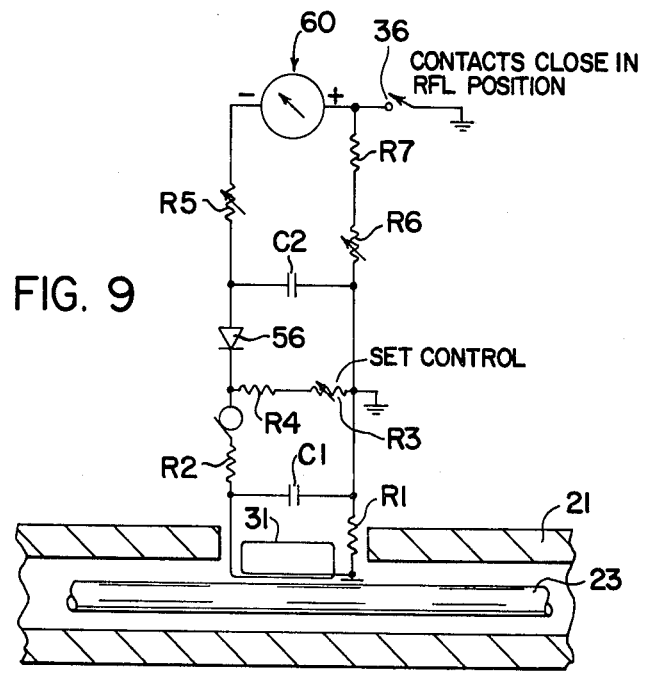
FIG. 9 is a view illustrating in diagrammatic form the coaxial line section and showing in diagrammatic form the electrical circuitry of a unit embodying the invention.

The meter circuit, best shown in FIG. 9, includes as conventional elements, a rectifier diode 56 of the germanium crystal type (e.g., 1N82 AG), a charging condenser C2 and a normally open mode selector switch 36 connected to the positive terminal of the D'Arsonval meter movement 60. The switch 36 is adapted to ground the positive terminal of the meter movement when closed in order to measure the level of the reflected RF voltage wave. The switch is open when the level of the forward RF voltage wave is being measured.

In order to improve the accuracy of the RF voltage wave measurement (forward and reflected) there is provided in accordance with the invention, a variable RF attenuator including a series resistor R2, a potentiometer R3 and a shunt resistor R4. The attenuator is placed in the circuit between the pick-up coil 31 and the rectifier diode 56. This arrangement results in a meter deflection D represented by the expression:

$$D = K_2 K_1 \sqrt{power} - f(diode)$$

since the output of the pick-up coil is proportional to $\sqrt{power}$. $K_1$ represents a loop constant and $K_2$ represents a constant introduced by the RF attenuator. Accordingly:

$$(K_2)^2 \cdot power = \left[ \frac{D + f(diode)}{K_1} \right]^2$$

Hence all meter deflections represent a value uniformly multiplied by $(K_2)^2$. Thus, adjustment of the potentiometer R3 results in a uniform scale expansion or compression without distortion.

The meter circuit also includes a reflected-mode calibration potentiometer R5 connected between the diode 56 and the negative terminal of the meter movement 60, a forward mode calibration potentiometer R6 and a fixed calibration resistor R7.

The values and functions of the various resistive and capacitive circuit elements are given in TABLE I below:

TABLE I

| Circuit Element | Resistance (Ohms) | Function |
| --- | --- | --- |
| R1 | 430 | Sampling Resistor |
| R2 | 240 | Series Resistor |
| R3 | 1000 | Scale Expanding Potentiometer |
| R4 | 240 | Shunt Resistor |
| R5 | 5K | Calibration Potentiometer (RFL) |
| R6 | 5K | Calibration Potentiometer (FWD) |
| R7 | 5K | Fixed Calibration Resistor (FWD) |
| — | Capacitance (Microfarads) | — |
| C1 | 18pf | Shunt Condenser |
| C2 | 470pf | Charge Condenser |

The conductive leads printed on the circuit board include a lead 43 extending from the circular wiper contact zone 44 to the shunt resistor R4, a lead 45 extends from the shunt resistor R4 to the potentiometer R3, and a lead 47 extending from the rectifier diode 56 to the charge condenser C2 and to the calibrating potentiometer R5. A ground conductive lead 46 connects the spacer sleeves 42 to the potentiometer R3, the charge condenser C2, and a second variable calibrating potentiometer R6. Another conductive lead 48 connects the calibrating potentiometer R6 to the fixed calibration resistor R7 which is connected electrically to the positive terminal of the D'Arsonval meter movement assembly 60.

The D'Arsonval meter movement assembly 60 is also mounted to the circuit board by screws 61 and 62 and is electrically connected by lead 63. The meter movement 60 causes the needle 65 to deflect across a meter scale 70 calibrated in watts.

While the invention has been shown and described with respect to a specific embodiment thereof, this is intended for the purpose of illustration rather than limitation and other modifications and variations in the specific form herein shown and described will be apparent to those skilled in the art all within the intended spirit and scope of the invention. Accordingly, the patent is not to be limited in scope and effect to the specific embodiment herein shown and described nor in any other way that is inconsistent with the extent to which the progress in the art has been advanced by the invention.

I claim:

1. In an instrument for detecting and measuring directional RF voltage wave signals on a coaxial transmission line and including a coaxial line section adapted to be inserted in said transmission line, an inductive pick-up coil mounted for rotation about an axis normal to the axis of said line section for selectively sensing and measuring the magnitude of both the forward and reflected RF voltage standing waves on said transmission line, D'Arsonval meter movement means, and circuit means operatively connected between said meter movement means and said inductive pick-up coil, said circuit means including a rectifier diode and a scale expanding potentiometer for setting the meter pointer to a fixed index point on the meter scale when said inductive pick-up coil is rotated to a position to sense the forward RF voltage wave on said transmission line whereby when said inductive pick-up coil is thereafter rotated approximately 180° to a position to sense the reflected RF voltage wave on said transmission line, said pointer may indicate the voltage standing wave ratio on a respective meter scale, the improvement wherein said circuit means comprises:

a variable RF attenuator electrically connected between said diode and said inductive pick-up coil, said attenuator including a series resistor, a shunt resistor and said scale expanding potentiometer connected in series with said shunt resistor, whereby the deflection of said D'Arsonval meter movement means is relatively undistorted throughout the range of induced RF voltage levels sensed by said pick-up coil.

* * * * *